(12) United States Patent
Noh

(10) Patent No.: US 8,877,587 B2
(45) Date of Patent: Nov. 4, 2014

(54) NONVOLATILE MEMORY DEVICE AND METHOD FOR FABRICATING THE SAME

(71) Applicant: SK Hynix Inc., Gyeonggi-do (KR)

(72) Inventor: Yoo-Hyun Noh, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 81 days.

(21) Appl. No.: 13/717,318

(22) Filed: Dec. 17, 2012

(65) Prior Publication Data

US 2014/0035024 A1  Feb. 6, 2014

(30) Foreign Application Priority Data

Aug. 2, 2012  (KR) .......................... 10-2012-0084755

(51) Int. Cl.
*H01L 21/336* (2006.01)
*H01L 29/792* (2006.01)
*H01L 27/115* (2006.01)
*H01L 29/66* (2006.01)

(52) U.S. Cl.
CPC ........ *H01L 29/792* (2013.01); *H01L 27/11582* (2013.01); *H01L 29/66833* (2013.01); *H01L 29/66666* (2013.01); *H01L 29/7926* (2013.01); *H01L 27/11573* (2013.01)
USPC ..... 438/268; 438/269; 257/324; 257/E21.423

(58) Field of Classification Search
CPC .................. H01L 29/792; H01L 29/66666
USPC .................. 438/268, 269; 257/324, E21.423
See application file for complete search history.

(56) References Cited

U.S. PATENT DOCUMENTS

| 2012/0003800 A1* | 1/2012 | Lee et al. ....................... 438/261 |
| 2012/0112260 A1* | 5/2012 | Kim et al. ...................... 257/315 |
| 2013/0168757 A1* | 7/2013 | Hong ............................. 257/324 |
| 2014/0099761 A1* | 4/2014 | Kim et al. ...................... 438/269 |

FOREIGN PATENT DOCUMENTS

KR          101113766          2/2012

* cited by examiner

*Primary Examiner* — David S Blum
(74) *Attorney, Agent, or Firm* — IP & T Group LLP

(57) ABSTRACT

A method for fabricating a nonvolatile memory device includes forming a stacked structure over a substrate defining a cell area and a peripheral area and having a source region, the stacked structure including interlayer dielectric layers and sacrifice layers, forming channel layers connected to the substrate through the stacked structure of the cell area, forming a first slit in the stacked structure of the cell area, forming a second slit in the stacked structure, the second slit including a first portion and a second portion, removing the sacrifice layers exposed through the first and second slits, forming conductive layers to fill spaces from which the sacrifice layers are removed, forming an insulating layer in the second slit, and forming a source contact by burying a conductive material in the first portion of the second slit having the insulating layer formed therein.

23 Claims, 12 Drawing Sheets

NONVOLATILE MEMORY DEVICE AND METHOD FOR FABRICATING THE SAME

CROSS-REFERENCE TO RELATED APPLICATIONS

The present application claims priority of Korean Patent Application No. 10-2012-0084755, filed on Aug. 2, 2012, which is incorporated herein by reference in its entirety.

BACKGROUND

1. Field

Exemplary embodiments of the present invention relate to a nonvolatile memory device and a method for fabricating the same, and more particularly, to a nonvolatile memory device including a plurality of memory cells stacked substantially perpendicularly from a substrate, and a method for fabricating the same.

2. Description of the Related Art

A nonvolatile memory device maintains data stored therein even though power supply is cut off. Currently, various nonvolatile memory devices such as a NAND flash memory and the like are widely used.

Recently, as the improvement in integration degree of a 2D nonvolatile memory device including memory cells formed as a signal layer over a silicon substrate approaches the limit, a 3D nonvolatile memory device including a plurality of memory cells stacked perpendicularly from a silicon substrate has been proposed.

FIGS. 1A to 1C are diagrams illustrating a conventional 3D nonvolatile memory device. FIG. 1A is a plan view, FIG. 1B is a cross-sectional view taken along line Y4-Y4' of FIG. 1A. FIG. 1C is a cross-sectional view taken along lines Y5-Y5' and Y6-Y6' of FIG. 1A.

Referring to FIGS. 1A to 1C, a method for fabricating the conventional nonvolatile memory device will be briefly described as follows.

First, a structure in which a plurality of interlayer dielectric layers 120 and sacrifice layers 130 are alternately stacked (hereinafter, referred to as a stacked structure) is formed over a substrate 100 defining a cell area B and a peripheral area A at both sides of the cell area B and having a source region 110 provided therein.

The stacked structure of the peripheral area A is etched in a stair shape.

The stacked structure of the cell area B is selectively etched to form a plurality of channel holes CH exposing the substrate 100 through the stacked structure, and a memory layer 140 and a channel layer 150 are then formed in the channel holes CH.

The stacked structure of the cell area B is selectively etched to form a first slit SA. Furthermore, the stacked structure of the cell area B and the peripheral area A is selectively etched to form a second slit SB. At this time, the second slit SB is extended to the peripheral area A as well as the cell area B, because the sacrifice layers 130 of the peripheral area A are partially removed to form conductive layers 180 to be connected to a word line contact WC. Furthermore, since the second slit SB must provide an area where a source contact SC is subsequently formed, the second slit SB has a relatively large width. Accordingly, the sidewall of the second slit SB has an inclined profile.

The sacrifice layers 130 exposed through the first and second slits SA and SB are removed, and conductive layer 180 are buried in spaces where the sacrifice layers 130 were removed.

The first slit SA is filled with an insulating material (not illustrated). Furthermore, an insulating layer 11 is formed on the sidewall of the second slit SB, and the rest of the first slit SA is filled with a conductive material to form a source contact SC.

Then, a word line contact WC connected to the conductive layers 180 in the peripheral area A is formed, thereby completing the device of FIGS. 1A to 1C.

In the above-described device, since the second slit SB must provide an area where the source contact SC is subsequently formed, the second slit SB needs to have sufficiently large width. In general, when an area having a relatively large width is etched, the slope of the etched portion of the area increases more than when an area having a relatively small width is etched. Therefore, the second slit SB has an inclined profile of which the width decreases from the top toward to the bottom. Because of the inclined profile of the second slit SB, the respective conductive layers 180 of the peripheral area A are positioned to deviate from each other in a perpendicular direction. That is, the conductive layers 180 are gradually moved to the outside, based on the second slit SB, from the bottom to the top. Therefore, when the position of the word line contact WC is decided based on the uppermost conductive layer 180 during the formation of the word line contacts WC, the positions of the lowermost conductive layer 180 and the word line contact WC may deviate from each other such that the lowermost conductive layer 180 and the word line contact WC are not connected to each other (refer to D).

However, if the width of the second slit B is reduced, it becomes difficult to form the source contact SC.

SUMMARY

Exemplary embodiments of the present invention are directed to a nonvolatile memory device and a method for fabricating the same, which is capable of preventing a defect from occurring during a fabrication process.

In accordance with an embodiment of the present invention, a method for fabricating a nonvolatile memory device may include forming a stacked structure over a substrate defining a cell area and a peripheral area and having a source region, the stacked structure including a plurality of interlayer dielectric layers and a plurality of sacrifice layers that are alternately stacked, forming a plurality of channel layers connected to the substrate through the stacked structure of the cell area, forming a first slit in the stacked structure of the cell area so that the first slit has a sufficient depth to pass through at least the lowermost sacrifice layer, forming a second slit in the stacked structure, the second slit including a first portion having a sufficient depth to expose the source region in the cell area and a second portion in the peripheral area that has a smaller width than the first portion, removing the sacrifice layers exposed through the first and second slits, forming a plurality of conductive layers to fill spaces from which the sacrifice layers are removed, forming an insulating layer in the second slit, and forming a source contact by burying a conductive material in the first portion of the second slit having the insulating layer formed therein.

In accordance with another embodiment of the present invention, a nonvolatile memory device may include a substrate defining a cell area and a peripheral area and having a source region, a first stacked structure formed over the substrate and including a plurality of interlayer dielectric layers and a plurality of conductive layers that are alternately stacked, a plurality of channel layers connected to the substrate through the first stacked structure of the cell area, a first slit formed in the first stacked structure of the cell area and having a sufficient depth to pass through at least the lowermost conductive layer, a second slit formed in the first stacked structure and including a first portion having a sufficient depth to expose the source region in the cell area and a second portion in the peripheral area that has a smaller width than the first portion, an insulating layer formed in the second slit, and a source contact buried in the first portion of the second slit having the insulating layer formed therein.

In accordance with yet another embodiment of the present invention, a method for fabricating a nonvolatile memory device may include forming a stacked structure over a substrate defining a cell area and a peripheral area, the stacked structure including a plurality of interlayer dielectric layers and a plurality of sacrifice layers that are alternately stacked, forming a plurality of channel layers through the stacked structure of the cell area, forming a first slit between the channel layers in the stacked structure of the cell area, and forming a second slit in the stacked structure, the second slit including a first portion between the channel layers in the cell area and a second portion in the peripheral area that has a smaller width than the first portion.

DETAILED DESCRIPTION

Figure 1A:
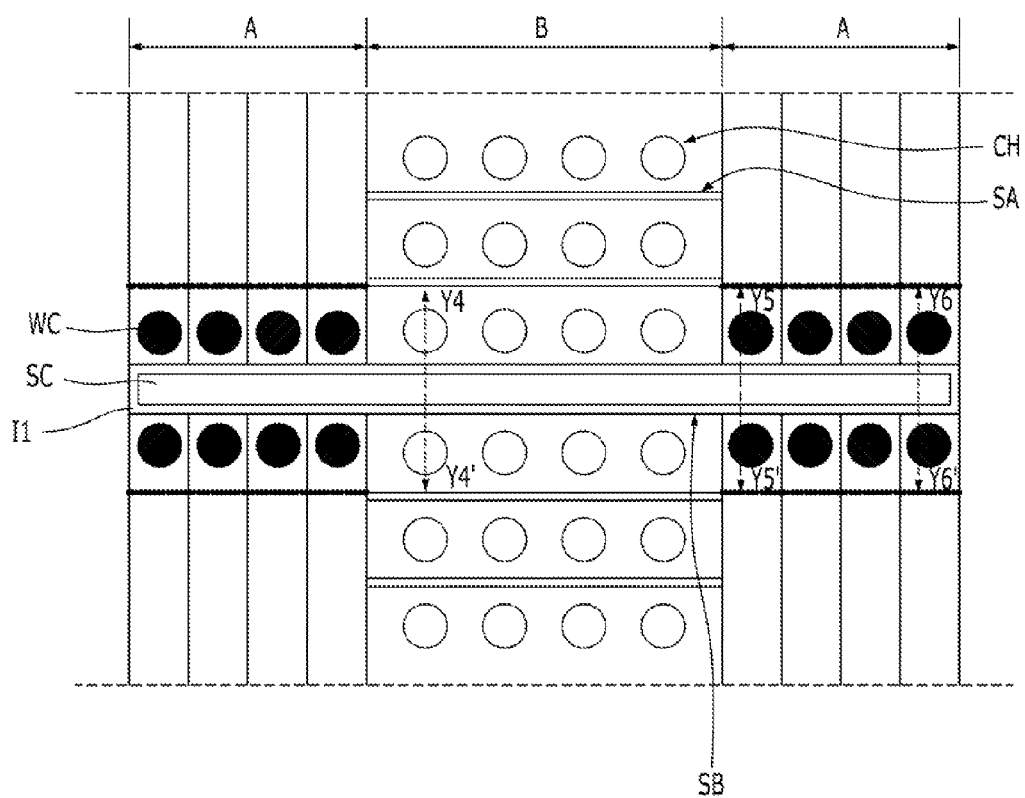
FIGS. 1A to 1C are diagrams illustrating a conventional 3D nonvolatile memory device.
Figure 1B:
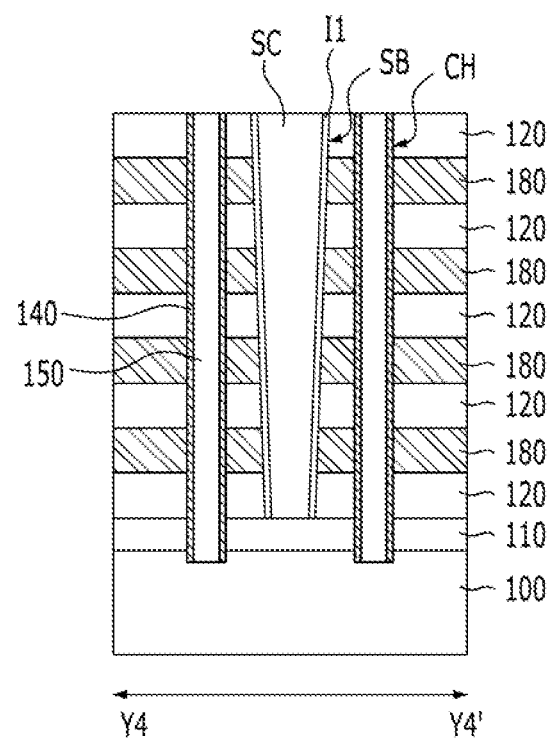
Figure 1C:
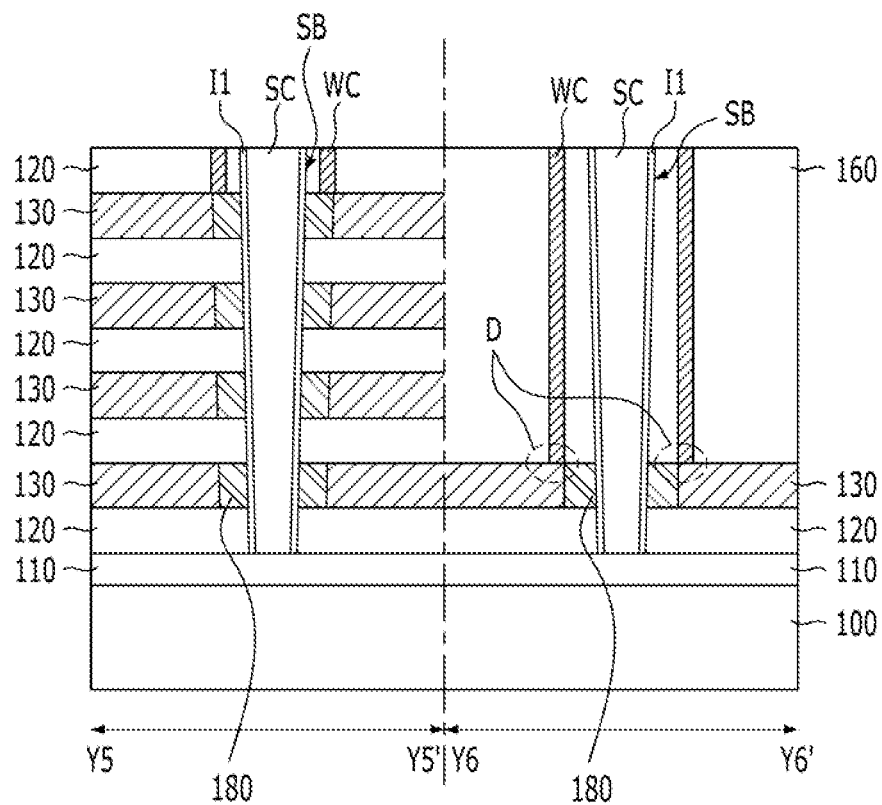

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances proportions may have been exaggerated in order to clearly illustrate features of the embodiments. It should be readily understood that the meaning of n and "over" in the present disclosure should be interpreted in the broadest manner such that "on" not only means "directly on" something but also include the meaning of "on" something with an intermediate feature or a layer therebetween, and that "over" not only means the meaning of "over" something may also include the meaning it is "over" something with no intermediate feature or layer therebetween (i.e., directly on something). In this specification, 'connected/coupled' represents that one component is directly coupled to another component or indirectly coupled through another component. In this specification, a singular form may include a plural form as long as it is not specifically mentioned in a sentence.

Figure 2A:
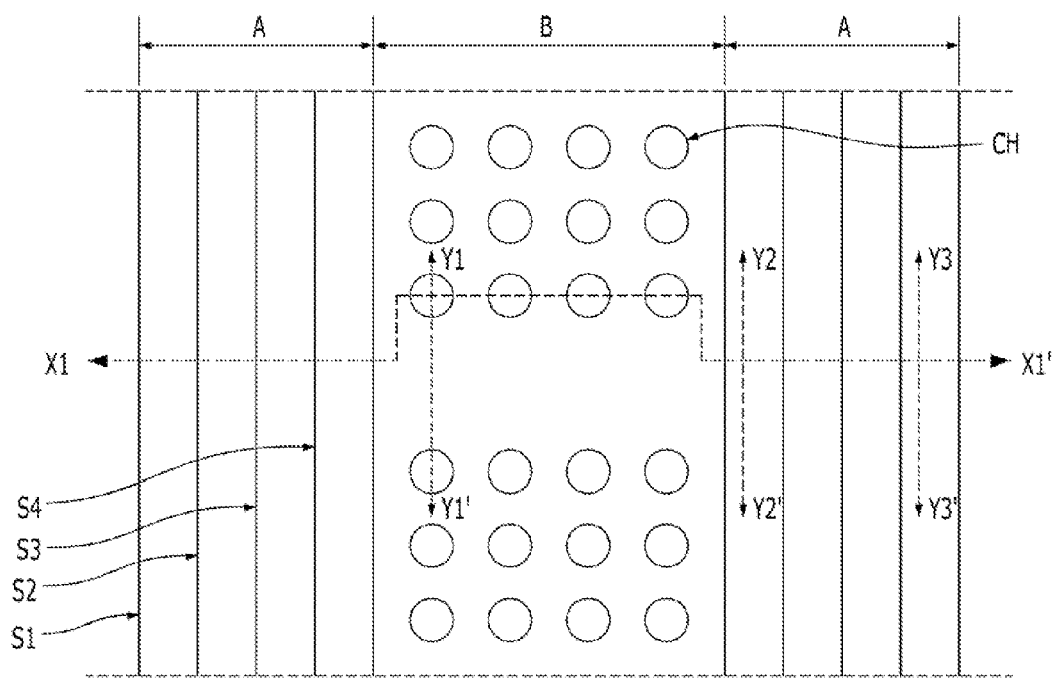
FIGS. 2A to 4C are diagrams illustrating a nonvolatile memory device and a method for fabricating the same in accordance with an embodiment of the present invention.
Figure 2B:
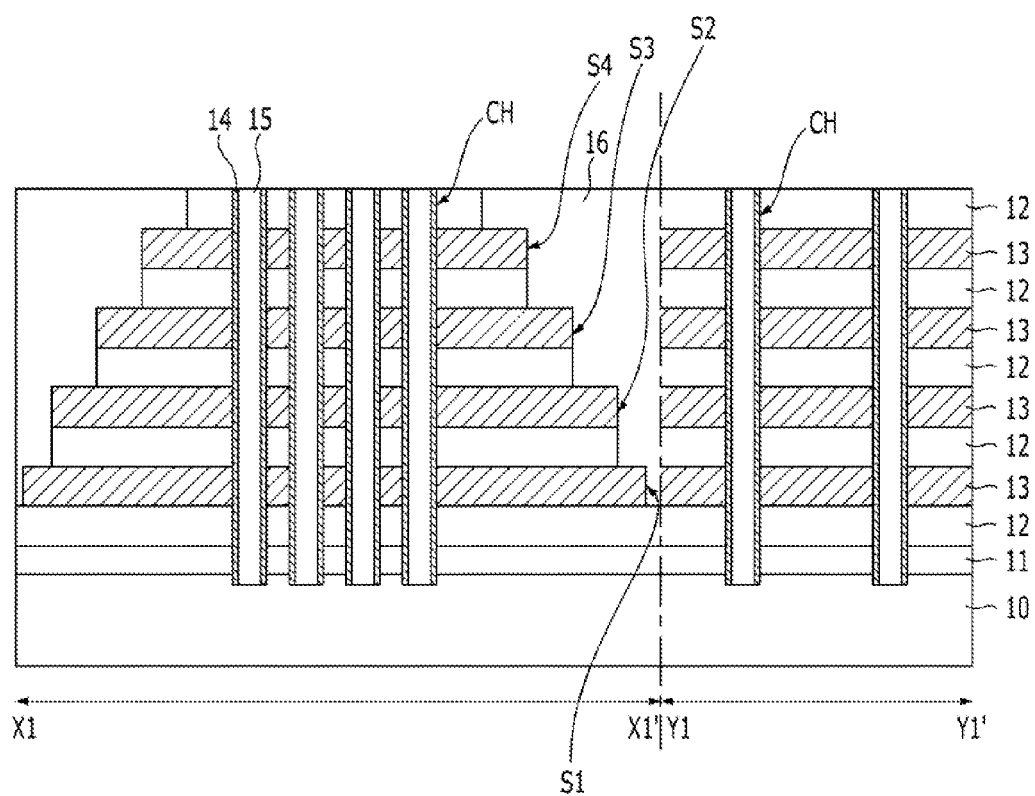
Figure 2C:
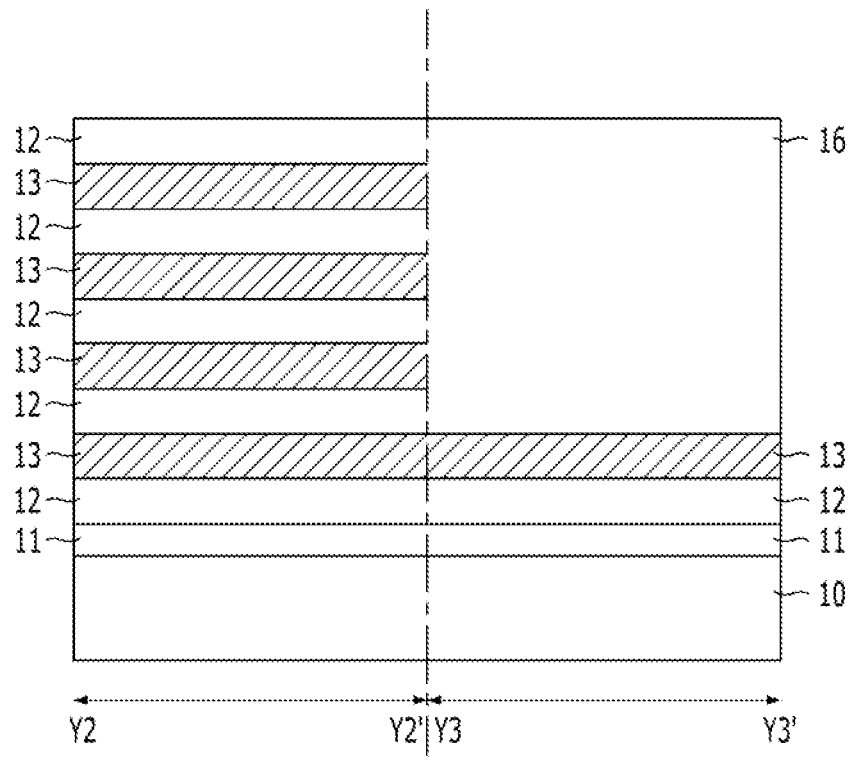
Figure 3A:
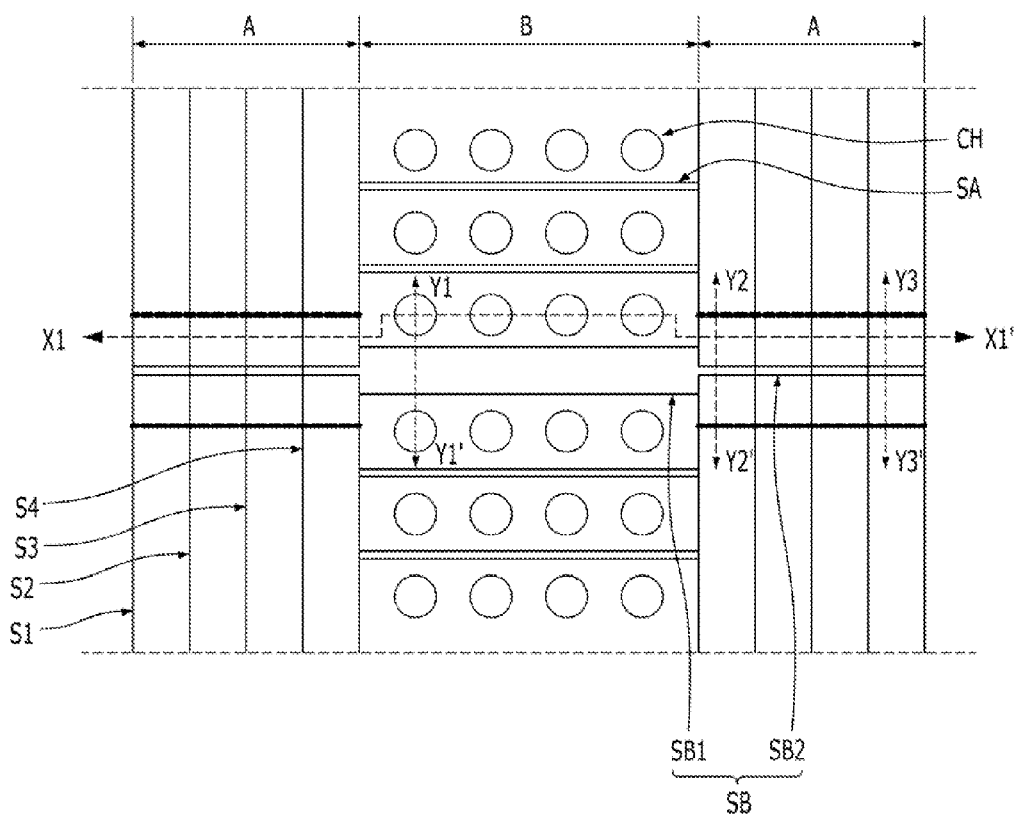
Figure 3B:
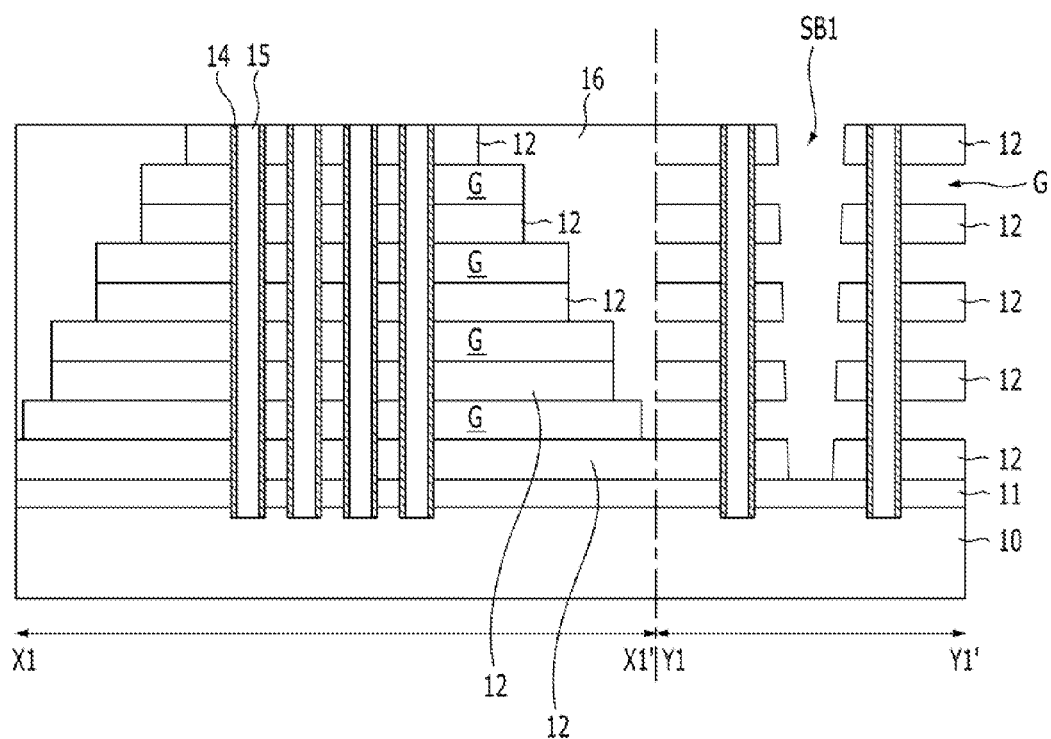
Figure 3C:
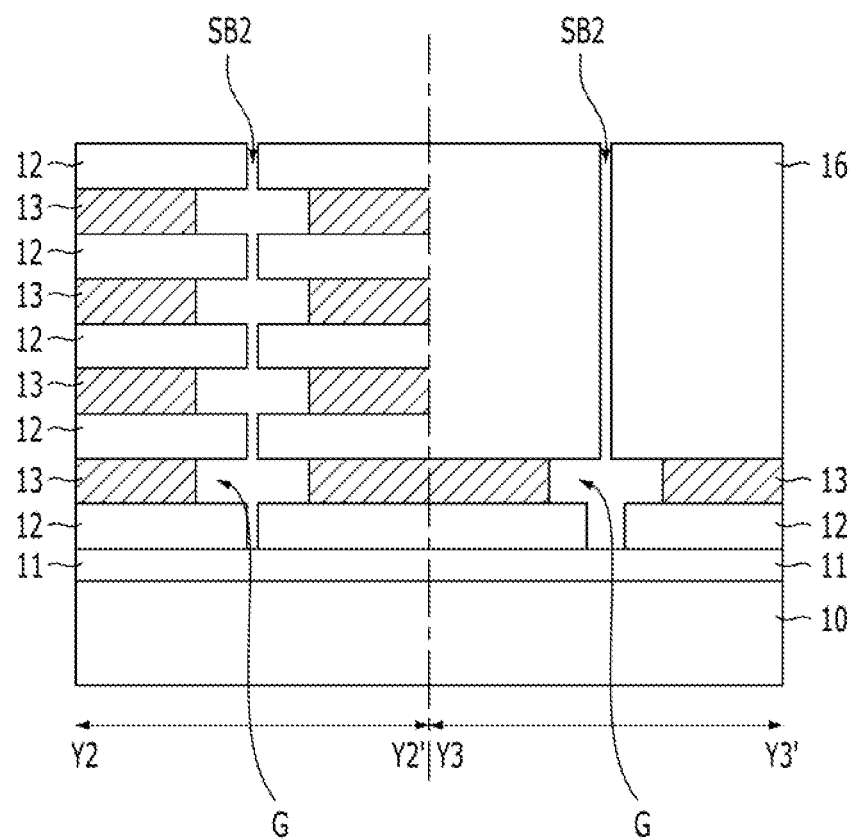
Figure 4A:
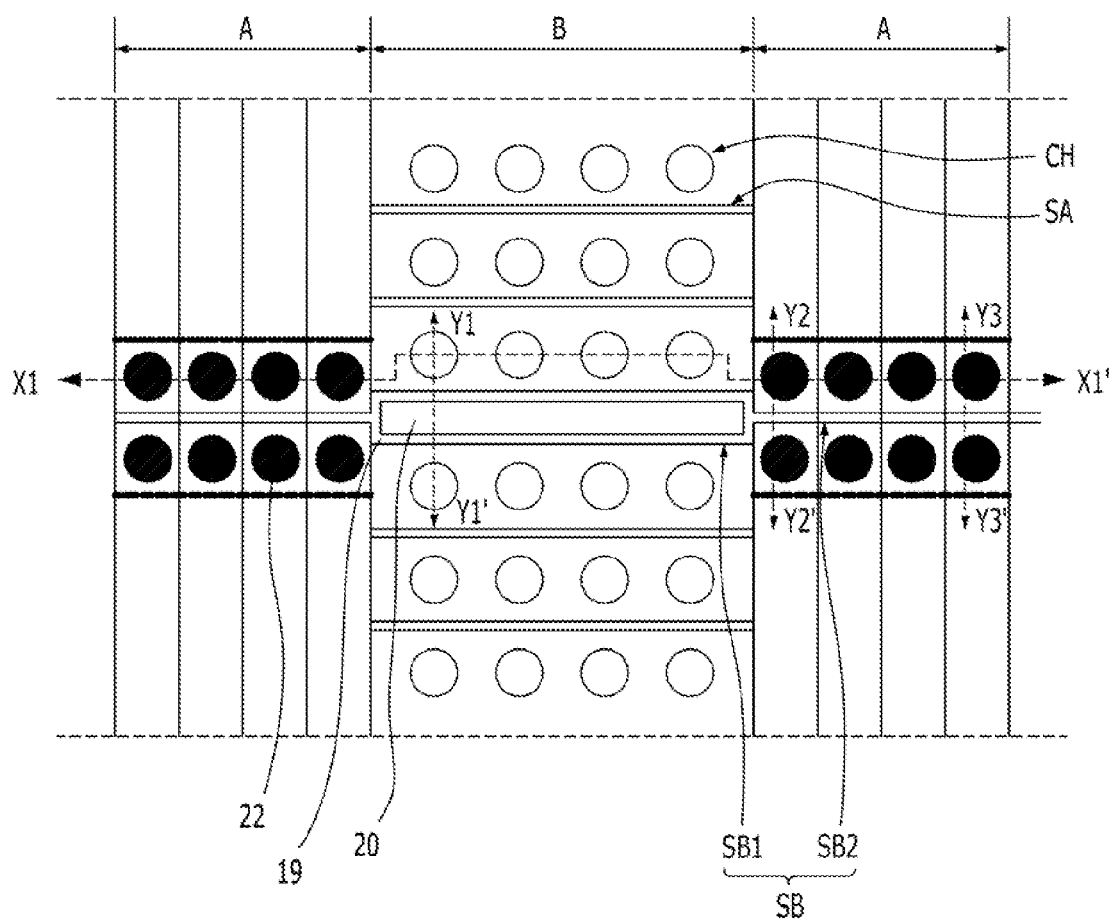
Figure 4B:
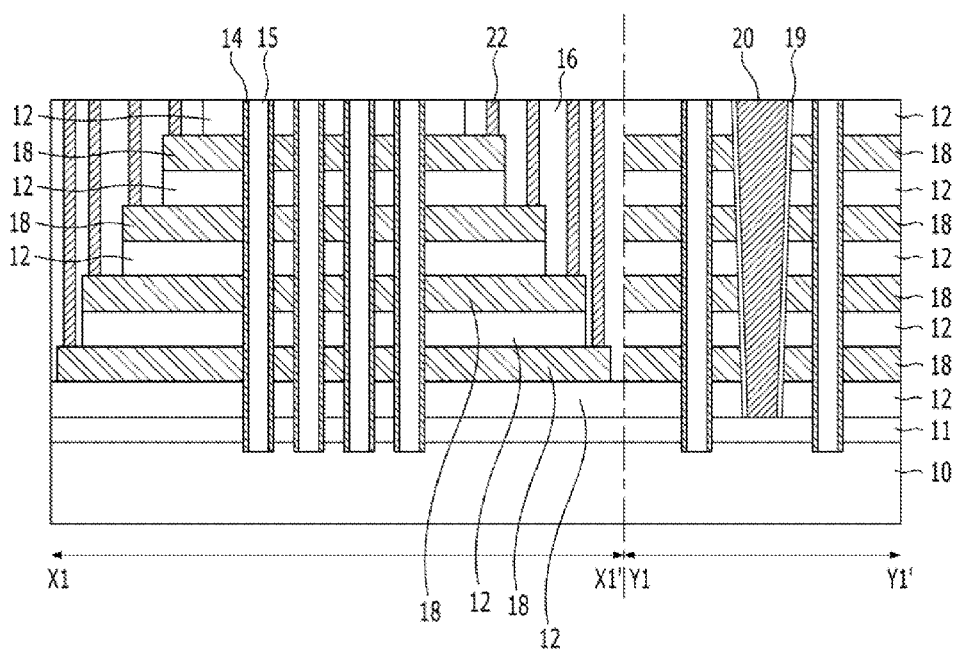
Figure 4C:
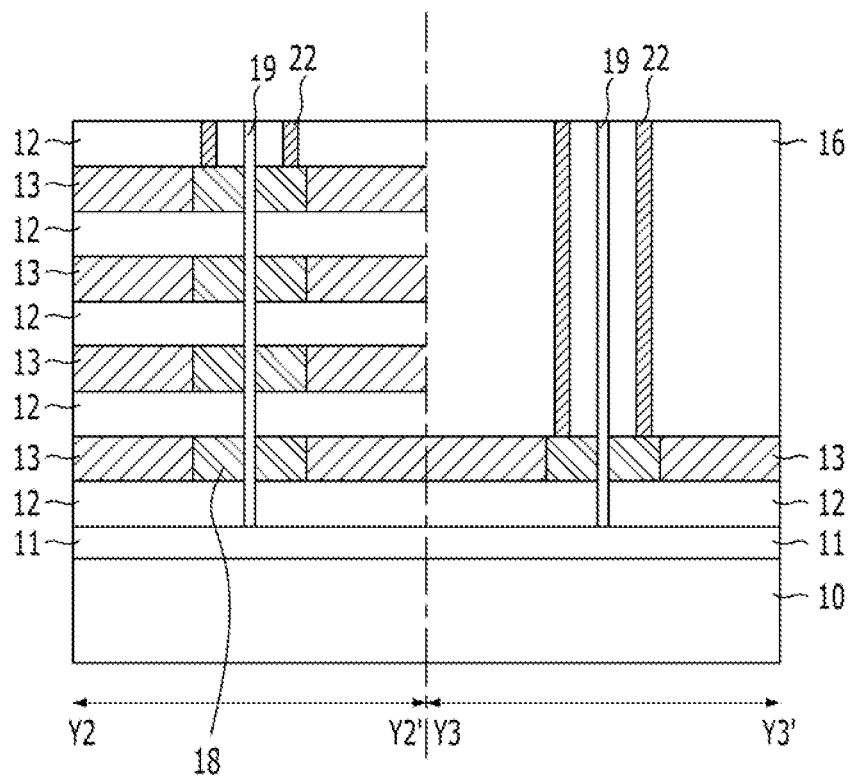

FIGS. 2A to 4C are diagrams for explaining a nonvolatile memory device and a method for fabricating the same in accordance with an embodiment of the present invention. FIGS. 4A to 4C illustrate the nonvolatile memory device, and FIGS. 2A to 3C illustrate intermediate steps for fabricating the device of FIGS. 4A to 4C. FIGS. 2A to 4A are plan views, FIGS. 2B to 4B are cross-sectional views taken along lines X1-X1' and Y1-Y1' of FIGS. 2A to 4A, and FIGS. 2C to 4C are cross-sectional views taken along lines Y2-Y2' and Y3-Y3' of FIGS. 2A to 4A, respectively.

First, the fabrication method will be described.

Referring to FIGS. 2A to 2C, a substrate 10 is prepared. The substrate 10 defines a cell area B in which memory cells are arranged and a peripheral area A disposed at both sides of the cell area B. At this time, when a direction parallel to line Y1-Y1' is referred to as a first direction and a direction crossing the first direction is referred to as a second direction, the peripheral area A is disposed at both sides of the cell area in the second direction. The substrate 10 may include a semiconductor material such as single crystal silicon. The substrate 10 includes a source region 11 disposed thereon. The source region 11 may be formed by doping an N-type impurity.

Over the substrate 10, a stacked structure is formed. The stacked structure includes a plurality of interlayer dielectric layers 12 and sacrifice layers 13 that are alternately stacked. The sacrifice layer 13 serves to provide a space where a gate of a memory cell (hereafter, referred to as a cell gate) subsequently formed in the cell area B, and the interlayer dielectric layer 12 serves to isolate cell gates at different layers. The interlayer dielectric layer 12 may include oxide, and the sacrifice layer 13 may include a material having a different etch rate from the interlayer dielectric layer 12, for example, nitride.

The stacked structure of the peripheral area A is etched in a stair shape. Accordingly, any one of the sacrifice layers 13 in the peripheral area A protrudes further than another sacrifice layer 13 positioned just above the sacrifice layer 13 in the second direction. For convenience of description, the sacrifice layers 13 are represented by S1, S2, S3, and S4 respectively, from the lowermost layer in the peripheral area A. The etch process for the stacked structure in the peripheral area A may be performed by a so-called slimming process in which a stacked structure is etched while the width of a mask is gradually reduced. Since the slimming process is already widely known, the detailed descriptions thereof are omitted herein. The space formed by etching the stacked structure in the peripheral area A is filled with a first insulating layer 16. The first insulating layer 16 may include oxide, for example.

The stacked structure of the cell area B is selectively etched to form a plurality of channel holes CH exposing the substrate 10 through the stacked structure. The plurality of channel holes CH may be arranged in a matrix shape along a first direction and a second direction crossing the first direction. The number of channel holes CH in the first and second directions may be changed in various manners.

Then, a memory layer 14 is formed on the sidewalls of the channel holes CH, and a channel layer 15 is formed to be buried in the channel holes CH. The memory layer 14 may have a triple-layer structure of a tunnel insulating layer, a charge trapping layer, and a charge blocking layer, which are sequentially arranged from a side close to the sacrifice layer 13. For example, the memory layer 14 may include an oxide-nitride-oxide (ONO) layer. The channel layer 15 may include a semiconductor material such as polysilicon. In this embodiment of the present invention, the channel layer 15 completely fills the channel hole CH having the memory layer 14 therein, but the present invention is not limited thereto. In another embodiment of the present invention, the channel layer 15 may be formed to such a thickness that would not completely fill the channel hole CH having the memory layer 14 formed therein. In this case, the rest of the channel hole CH may be filled with an insulating material.

In this embodiment of the present invention, the etching of the stacked structure of the peripheral area A is first performed, and the channel holes CH, the channel layer 15 and the memory layer 14 are then formed. However, the present invention is not limited thereto, and the process sequence may be changed.

Referring to FIGS. 3A to 3C, the stacked structure of the cell area B is selectively etched to form a plurality of first slits SA. The first slit SA for removing the sacrifice layers 13 of the cell area B may have such a depth to pass through at least the lowermost sacrifice layer 13. Furthermore, the first slit SA may isolate strings of memory cells subsequently formed along the respective channel layers 15 in the first direction corresponding to the extension direction of a bit line (not illustrated). For this structure, the first slit SA may be disposed between the adjacent channel layers 15 in the first direction and extended in the second direction in the cell area B. The first slit SA is not formed in the peripheral area A. This is to prevent the structures of the peripheral area A and the cell area B from collapsing during a subsequent process of removing the sacrifice layers 13.

Furthermore, the stacked structures of the cell area B and the peripheral area A are selectively etched to form a second slit SB. The second slit SB includes a first portion SB1 of the cell area B and a second portion SB2 of the peripheral area A. The first portion SB1 plays a similar role to the first slit SA for removing the sacrifice layers 13 in the cell area B and/or isolating the strings in the first direction, and serves to provide a space where a source contact connected to the source region 11 is subsequently formed. Therefore, the first portion SB1 has a similar plan shape to the first slit SA, except that the width thereof in the first direction is larger than the first slit SA. Furthermore, the first portion SB has such a depth to expose the source region 11. The second portion 582 is extended from the first portion SB1 to the peripheral area A, in order to partially remove the sacrifice layers 13 at both sides of the second portion 582 in the first direction.

The first slits SA and the second slit SB may be alternately arranged between the channel layers 15 in the first direction. In addition, one or more first slits SA and one second slit SB may be alternately arranged. In this embodiment of the present invention, three first slits SA and one second slit SB are alternately arranged, but the present invention is not limited thereto. The number of first slits SA arranged alternately with the second slit SB may change in consideration of the resistance of the source contact and other design considerations.

At this time, the first-direction width of the second portion SB2 of the second slit SB may be set smaller than that of the first portion SB1. This is because a source contact may not exist in the peripheral area A. In this case, the sidewall of the second portion SB2 of the second slit SB may have a relatively vertical profile, compared with the sidewall of the first portion SB1.

The sacrifice layers 13 exposed through the first slits SA and the second slit SB are removed by a wet etch process or the like. As a result, the sacrifice layers 13 of the cell area B are completely removed through the first slits SA and the first portion SB1 of the second slit SB. On the other hand, the sacrifice layers 13 of the peripheral area A are removed by a predetermined width in the first direction through the second portion SB2 of the second slit. SB. For example, the sacrifice layers 13 are removed by a width corresponding to a portion between thick dotted lines in FIG. 3A. In FIGS. 3A and 3B, spaces formed by removing the sacrifice layers 13 are represented by symbol G.

As described above, the second portion SB2 of the second slit SB has a small width, and the sidewall of the second portion SB2 has a relatively vertical profile. Therefore, the sidewalls of the spaces G formed by removing the sacrifice layers 13 in the peripheral area A may be positioned on substantially the same vertical line, which is perpendicular from the surface of the substrate 10.

Referring to FIGS. 4A to 4C a plurality of conductive layers 18 are formed by burying a conductive material in the spaces G formed by removing the sacrifice layers 13. The conductive material may include impurity-doped polysilicon, metal, or metal nitride, for example. The conductive layer 18 of the cell area B serves as a cell gate, and the conductive layer 18 of the peripheral area A is connected to a word line contact to be described below. As described above, the spaces G of the peripheral area A are positioned on substantially the same vertical line. Accordingly, the conductive layers 18 of the peripheral area A may also be positioned on substantially the same vertical line. In other words, the respective conductive layers 18 of the peripheral area A exist at substantially the same position in the first direction, regardless of the levels thereof.

The first slits SA are filled with an insulating material (not illustrated), and a second insulating layer 19 is formed on the sidewall of the second slit SB. The second insulating layer 19 has a relatively small thickness to sufficiently provide a space where a source contact is subsequently formed in the first portion SB1 of the second slit SB. At this time, since the width of the second portion SB2 of the second slit SB is smaller than that of the first portion SB1, the second portion SB2 may be completely filled with the second insulating layer 19. The second insulating layer 19 may include oxide, for example.

The rest of the second slit SB having the second insulating layer 19 formed therein is filled with a conductive material to form a source contact 20 connected to the source region 11.

Then, a word line contact 22 is formed to be connected to the conductive layers 18 of the peripheral area A. At this time, since the conductive layers 18 are positioned on substantially the same vertical line, the possibility that the conductive layers 18 and the word line contact 22 deviate from each other may significantly decreases. Therefore, it may be possible to alleviate a concern in the conventional method, in which the lowermost conductive layer and the word line contact deviate from each other and are not properly connected.

The device illustrated in FIGS. 4A to 4C may be fabricated by the above-described method.

Referring to FIGS. 4A to 4C, the plurality of pillar-shaped channel layers 15 arranged in a matrix shape, the plurality of conductive layers 18 for forming cell gates stacked along the channel layer 15, and the memory layer 14 interposed between the channel layer 15 and the conductive layers 18 are arranged over the substrate 10 of the cell area B. One channel layer 15, one conductive layer 18, and the memory layer 14 interposed therebetween form a unit memory cell.

Over the substrate of the peripheral area A, the stair-shaped structure is disposed. In particular, the plurality of conductive layers 18 are arranged in a stair shape at a predetermined portion (refer to a portion between thick dotted lines) based on the second portion SB2 of the second slit SB, and the plurality of sacrifice layers 13 are arranged in a stair shape at the other portions.

Inside the stacked structure of the interlayer dielectric layers 12 and the conductive layers 18 in the cell area B, the first slit SA is formed to a sufficient depth to pass through at least the lowermost sacrifice layer 13. Inside the stacked structure of the interlayer dielectric layers 12 and the conductive layers 18 in the cell area B and the peripheral area A, the second slit SB is formed to a sufficient depth to expose the source region 11. At this time, the second slit SB includes the first portion SB1 of the cell area B and the second portion 582 of the peripheral area A. The first portion 581 and the first slits SA are alternately disposed between the adjacent channel layers 15 in the first direction, and the second portion SB2 is extended from the first portion 581 in the second direction.

The first slit SA may be filled with an insulating material. The second insulating layer 19 is disposed on the sidewall of the first portion 581 of the second slit SB, and the source contact 20 is buried in the rest of the first portion SB1. The second insulating layer 19 may fill the second portion 582 of the second slit SB.

In accordance with the embodiments of the present invention, the source contact 20 may be positioned in the cell area B to reduce the width of the second slit SB in the peripheral area A. Accordingly, the conductive layers 18 formed in the peripheral area A are positioned on substantially the same vertical line, regardless of the levels thereof, which makes the connection between the word line contact 22 and the conductive layers 18 more convenient and feasible.

Furthermore, since the width of the second slit SB may be controlled differently in the cell area B and the peripheral area A, the width of the second slit SB in the cell area B may be increased without being restricted by the peripheral area A. In this case, since the sidewall slope of the second slit SB in the cell area B increases, the burial characteristic may improve when the source contact 20 is formed.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a nonvolatile memory device, comprising:
    forming a stacked structure over a substrate defining a cell area and a peripheral area and having a source region, the stacked structure including a plurality of interlayer dielectric layers and a plurality of sacrifice layers that are alternately stacked;
    forming a plurality of channel layers connected to the substrate through the stacked structure of the cell area;
    forming a first slit in the stacked structure of the cell area so that the first slit has a sufficient depth to pass through at least the lowermost sacrifice layer;
    forming a second slit in the stacked structure, the second slit including a first portion having a sufficient depth to expose the source region in the cell area and a second portion in the peripheral area that has a smaller width than the first portion;
    removing the sacrifice layers exposed through the first and second slits;
    forming a plurality of conductive layers to fill spaces from which the sacrifice layers are removed;
    forming an insulating layer in the second slit; and
    forming a source contact by burying a conductive material in the first portion of the second slit having the insulating layer formed therein.

2. The method of claim 1, wherein the first portion has a larger slope than the second portion.

3. The method of claim 1, wherein, in the forming of the insulating layer, the first slit is filled with the insulating layer.

4. The method of claim 1, further comprising etching the stacked structure of the peripheral area so that one of the sacrifice layers in the peripheral area protrudes further than another sacrifice layer positioned just above the sacrifice layer, after forming the stacked structure.

5. The method of claim 4, wherein one of the conductive layers in the peripheral area has an end protruding further than another conductive layer positioned just above the conductive layer, and
    the method further comprises forming a word line contact over the protruding end, after the forming of the conductive layers.

6. The method of claim wherein the first portion has a larger width than the first slit.

7. The method of claim 1, wherein the peripheral area includes a first peripheral area and a second peripheral area that exist at both sides of the cell area, respectively,
    the first and the second slits are in a same direction,
    the first slit crosses the cell area, and
    the second slit crosses the cell area, the peripheral area and the second peripheral area.

8. The method of claim 1, wherein one or more first slits and one second slit are alternately disposed between the channel layers.

9. The method of claim 1, wherein the second portion is completely filled with the insulating layer, and
    the source contact is positioned only in the cell area.

10. The method of claim 1, wherein a memory layer including a charge blocking layer, a charge storing layer, and a tunnel insulating layer is interposed between the conductive layers and the channel layer.

11. A nonvolatile memory device comprising:
    a substrate defining a cell area and a peripheral area and having a source region;
    a first stacked structure formed over the substrate and including a plurality of interlayer dielectric layers and a plurality of conductive layers that are alternately stacked;
    a plurality of channel layers connected to the substrate through the first stacked structure of the cell area;
    a first slit formed in the first stacked structure of the cell area and having such a sufficient depth to pass through at least the lowermost conductive layer;
    a second slit formed in the first stacked structure and including a first portion having a sufficient depth to expose the source region in the cell area and a second portion in the peripheral area that has a smaller width than the first portion;
    an insulating layer formed in the second slit; and
    a source contact buried in the first portion of the second slit having the insulating layer formed therein.

12. The nonvolatile memory device of claim 11, wherein the first stacked structure of the peripheral area exists by a predetermined width at both sides of the second portion, and
    the nonvolatile memory device further comprises a second stacked structure formed over the substrate of the peripheral area and including the plurality of interlayer dielectric layers and a plurality of sacrifice layers that are alternately stacked.

13. The nonvolatile memory device of claim 11, wherein the first portion has a larger slope than the second portion.

14. The nonvolatile memory device of claim 11, wherein the insulating layer fills the first slit.

15. The nonvolatile memory device of claim 11, wherein one of the conductive layers in the peripheral area has an end protruding further than another conductive layer positioned just above the conductive layer, and
    the nonvolatile memory device further comprises a word line contact formed over the protruding ends.

16. The nonvolatile memory device of claim 11, wherein the first portion has a larger width than the first slit.

17. The nonvolatile memory device of claim 11,
wherein the peripheral area includes a first peripheral area and a second peripheral area that exist at both sides of the cell area, respectively,
the first and the second slits are in a same direction,
the first slit crosses the cell area, and
the second slit crosses the cell area, the first peripheral area and the second peripheral area.

18. The nonvolatile memory device of claim 11, wherein one or more first slits and one second slit are alternately disposed between the channel layers.

19. The nonvolatile memory device of claim 11, wherein the second portion is completely filled with the insulating layer, and
the source contact is positioned only in the cell area.

20. The nonvolatile memory device of claim 11, wherein a memory layer including a charge blocking layer, a charge storing layer, and a tunnel insulating layer is interposed between the conductive layers and the channel layer.

21. A method for fabricating a nonvolatile memory device, comprising:
forming a stacked structure over a substrate defining a cell area and a peripheral area, the stacked structure including a plurality of interlayer dielectric layers and a plurality of sacrifice layers that are alternately stacked;
forming a plurality of channel layers through the stacked structure of the cell area;
forming a first slit between the channel layers in the stacked structure of the cell area; and
forming a second slit in the stacked structure, the second slit including a first portion between the channel layers in the cell area and a second portion in the peripheral area that has a smaller width than the first portion.

22. The method of claim 21,
wherein the peripheral area includes a first peripheral area and a second peripheral area that exist at both sides of the cell area, respectively,
the first and second slits are in a same direction,
the first slit crosses the cell area, and
the second slit crosses the cell area, the first peripheral area and the second peripheral area.

23. The method of claim 21, wherein one or more first slits and one second slit are alternately disposed between the channel layers.

* * * * *